United States Patent
Carr et al.

(10) Patent No.: US 6,519,075 B2
(45) Date of Patent: *Feb. 11, 2003

(54) PACKAGED MEMS DEVICE AND METHOD FOR MAKING THE SAME

(75) Inventors: Dustin W. Carr, Pittstown, NJ (US); Dennis S. Greywall, Whitehouse Station, NJ (US); Sungho Jin, Millington, NJ (US); Flavio Pardo, New Providence, NJ (US); Hyongsok Soh, Basking Ridge, NJ (US)

(73) Assignees: Agere Systems Inc., Allentown, PA (US); Lucent Technologies Inc., Murray Hill, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/769,192

(22) Filed: Jan. 25, 2001

(65) Prior Publication Data

US 2002/0054422 A1 May 9, 2002

Related U.S. Application Data

(63) Continuation-in-part of application No. 09/705,350, filed on Nov. 3, 2000, now Pat. No. 6,442,307.

(51) Int. Cl.[7] ............................................. G02B 26/00
(52) U.S. Cl. ..................... 359/291; 359/291; 359/290
(58) Field of Search ................................ 359/245, 248, 359/290, 291, 295, 298, 308, 871; 385/140, 24, 73; 310/36, 37; 438/106; 73/504.02

(56) References Cited

U.S. PATENT DOCUMENTS 6,044,705 A  * 4/2000  Neukermans et al. .... 73/504.02
6,297,072 B1 * 10/2001 Tilmans et al. ............. 438/106

* cited by examiner

Primary Examiner—Georgia Epps
Assistant Examiner—Gary O'Neill

(57) ABSTRACT

A MEMs device comprises a component layer including a frame structure and at least one component movably coupled to the frame and an actuator layer including at least one conductive path and at least one actuator for moving the component. The component layer and the actuator layer are bonded together with solder or other materials in lateral alignment. Advantageously the layers are provided with metallization pads and are bonded together in lateral alignment with predetermined vertical gap spacing by solder bonds between the pads. In a preferred embodiment the MEMs device, however bonded, comprises a component layer, an actuator layer and an intervening spacer. The spacer provides the walls of a cavity between the component and the pertinent actuators to permit movement of the component. The walls cover the bulk of the peripheral boundary of the cavity to provide aerodynamic isolation. Advantageously the walls are conductive to provide electrostatic isolation. The device has particular utility in optical cross connection, variable attenuation and power gain equalization.

37 Claims, 14 Drawing Sheets

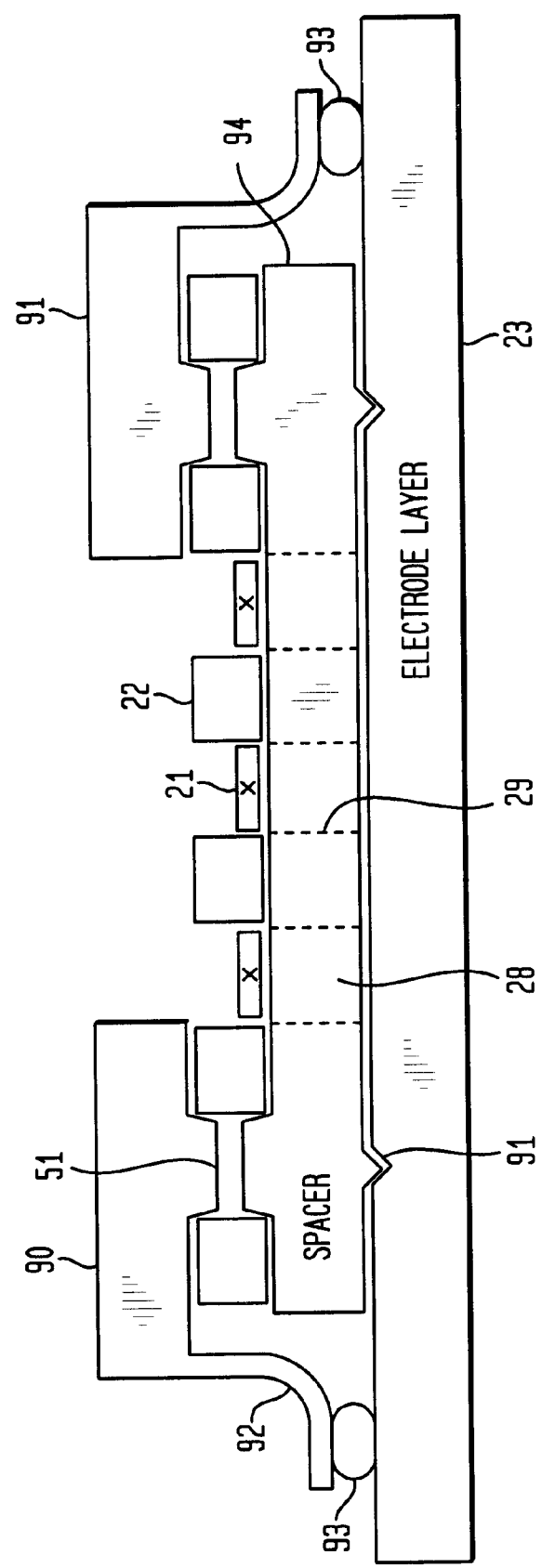

# PACKAGED MEMS DEVICE AND METHOD FOR MAKING THE SAME

CROSS-REFERENCE TO RELATED APPLICATIONS

This application is a continuation-in-part of U.S. patent application Ser. No. 09/705,350 filed by D. W. Carr et al. on Nov. 3, 2000 now U.S. Pat. No. 6,442,307 and entitled "Solder-Packaged Optical MEMs Device and Method for Making the Same", which is incorporated herein by reference.

FIELD OF THE INVENTION

The present invention relates to micro-electro-mechanical devices ("MEMs devices") and, in particular, to MEMs devices constructed using solder bond assembly and/or MEMs devices having improved spacers for enhanced isolation. The inventive MEMs devices are particularly useful as movable mirror devices for beam steering in optical communication systems.

BACKGROUND OF THE INVENTION

MEMs devices are of considerable importance in optical communication systems. In one important application, a MEMs device provides a two-dimensional array of movable components, such as mirrors, sensors, or even mechanical paddles. Each movable component in the array can be electrically moved.

A typical MEMs mirror device comprises an array of metal-coated silicon mirrors, each mirror movably coupled to a surrounding silicon frame via a gimbal. Two torsional members on opposite sides of the mirror connect the mirror to the gimbal and define the mirror's axis of rotation. The gimbal, in turn, is coupled to the surrounding silicon frame via two torsional members defining a second axis of rotation orthogonal to that of the mirror. A light beam can therefore be steered in any direction.

Electrodes are disposed in a cavity underlying the mirror and the gimbal. Voltages applied between the mirror and an underlying electrode and between the gimbal and an electrode control the orientation of the mirror. Alternatively, in slightly modified arrangements, an electrical signal can control the position of the mirror magnetically or piezoelectrically.

FIGS. 1(a) and 1(b) illustrate conventional optical MEMs devices and their application. FIG. 1(a) shows a typical prior art optical MEMs mirror structure. The device comprises a mirror 1 coupled to a gimbal 2 on a polysilicon frame 3. The components are fabricated on a substrate 4 by micromachining processes such as multilayer deposition and selective etching. After etching, mirror assembly (1, 2, 3) is raised above the substrate 4 by upward bending lift arms 5 during a release process. The mirror 1 in this example is double-gimbal cantilevered and attached onto the frame structure 3 by torsional springs 6. The mirrors can be tilted to any desired orientation for optical signal routing via electrostatic or other actuation with electrical voltage or current supplied as to electrodes 7 from outside. The light-reflecting surface of mirror 1 comprises a metal-coated polysilicon membrane, which is typically of circular shape. The metal layers 8 are deposited by known thin film deposition methods such as evaporation, sputtering, electrochemical deposition, or chemical vapor deposition.

FIG. 1(b) schematically illustrates an important application of optical MEMs mirrors as controllable mirror arrays for optical signal routing. The cross connect system shown here comprises optical input fibers 10, optical output fibers 11 and an array of MEMs mirrors 1 on a substrate 4. The optical signals from the input fibers 10 are incident on aligned mirrors 1. The mirrors 1, with the aid of an auxiliary mirror 12 and appropriate imaging lenses 13, are electrically controlled to reflect the incident optical signals to respective output fibers 11. In alternative schemes, the input fibers and the output fibers are in separate arrays, and a pair of MEMs mirror arrays are used to perform the cross connect function.

The tilting of each mirror is controlled by applying specific electric fields to one or more of the electrodes (not shown) beneath the mirror. Undesirable variations in the gap spacing between the mirror layer and the electrode layer alter the electric field, which affects the degree of mirror tilting. This in turn alters the path or coherency of light signals reaching the receiving fibers, thus increasing the signal loss during beam steering.

A MEMs device is essentially composed of two layers: a component layer comprising the array of microscale components, such as microscale mirror elements, movably coupled to a surrounding frame and an actuator layer comprising the microscale actuators, such as microscale electrodes, and the conductive paths needed to move the components. Microscale components typically have a maximum dimension of less than 10,000 micrometers. One approach to fabricating the array is to fabricate the actuator layer and the component layer as successive layers on the same workpiece and then to lift up the component layer above the actuator layer using vertical thermal actuators or stresses in thin films. This lift-up process is described in U.S. patent application Ser. No. 09/415,178 filed by V. A. Aksyuk et al. on Nov. 8, 1999 now U.S. Pat. No. 6,300,619 and assigned to applicant's assignee.

An alternative approach is to fabricate the component layer on one substrate, the actuator layer on a separate substrate and then to assemble the mating parts with accurate alignment and spacing. The two-part assembly process is described in U.S. Pat. No. 5,629,790 issued to Neukermans et al. on May 13, 1997 and in U.S. patent application Ser. No. 09/559,216 filed by Greywall on Apr. 26, 2000, now U.S. Pat. No. 6,201,631 both of which are incorporated herein by reference. This two-part assembly provides a more robust structure, greater component packing density and permits larger component sizes and rotation angles as well as scalability to larger arrays.

In the two-part assembly process, the component layer and the actuator layer should be bonded for mechanical sturdiness and long-term reliability. Neukermans et al. and Greywall suggest anodic bonding, solder glass bonding, and epoxy bonding. The gap spacing between the component layer and the actuator layer determines the electric field for a given magnitude of applied voltage (or the magnetic field for a given electrical current). Accordingly there is a need for accurate and reliable establishment of the gap spacing during the assembly and bonding of the two parts, dimensional stability of the gap, and accurate lateral alignment of the components and the actuators.

Another difficulty with conventional MEMs devices is a tendency toward cross talk among the components. In an array of movable MEMS components the actuated movement of one component may cause movement of adjacent components. For example, the electrostatic actuation of one micro mirror may cause unintended movement of adjacent mirror. Such unintended movement, in turn, can have undesirable consequences such as inaccurate beam steering by the adjacent mirrors. Accordingly, there is a need for MEMS, devices having enhanced isolation between adjacent components.

SUMMARY OF THE INVENTION

In accordance with the invention, a MEMs device comprises a component layer including a frame structure and at least one component movably coupled to the frame and an actuator layer including at least one conductive path and at least one actuator for moving the component. The component layer and the actuator layer are solder bonded together in lateral alignment. Advantageously the layers are provided with metallization pads and are bonded together in lateral alignment with predetermined vertical gap spacing by solder bonds between the pads. In a preferred embodiment the MEMs device, however bonded, comprises a component layer, an actuator layer and an intervening spacer. The spacer provides the walls of a cavity between the component and the pertinent actuators to permit movement of the component. The walls cover the bulk of the peripheral boundary of the cavity to provide aerodynamic isolation. Advantageously the walls are conductive to provide electrostatic isolation. The device has particular utility in optical cross connection, variable attenuation and power gain equalization.

SUMMARY OF THE INVENTION

In accordance with the invention, a MEMs device comprises a component layer including a frame structure and at least one component movably coupled to the frame and an actuator layer including at least one conductive path and at least one actuator for moving the component. The component layer and the actuator layer are solder bonded together in lateral alignment. Advantageously the layers are provided with metallization pads and are bonded together in lateral alignment with predetermined vertical gap spacing by solder bonds between the pads. In a preferred embodiment the MEMs device, however bonded, comprises a component layer, an actuator layer and an intervening spacer. The spacer provides the walls of a cavity between the component and the pertinent actuators to permit movement of the component. The walls cover the bulk of the peripheboundary of the cavity to provide aerodynamic isolation. Advantageously the walls are conductive to provide electrostatic isolation. The device has particular utility in optical cross connection, variable attenuation and power gain equalization.

BRIEF DESCRIPTION OF THE DRAWINGS

The nature, advantages and various additional features of the invention will appear more fully upon consideration of the illustrative embodiments now to be described in detail with the accompanying drawings. In the drawings:

FIG. 9 illustrates an exemplary arrangement for attaching a stiffener frame;

It is to be understood that the drawings are for purposes of illustrating the concepts of the invention and are not to scale.

DETAILED DESCRIPTION OF THE INVENTION

Figure 2A:
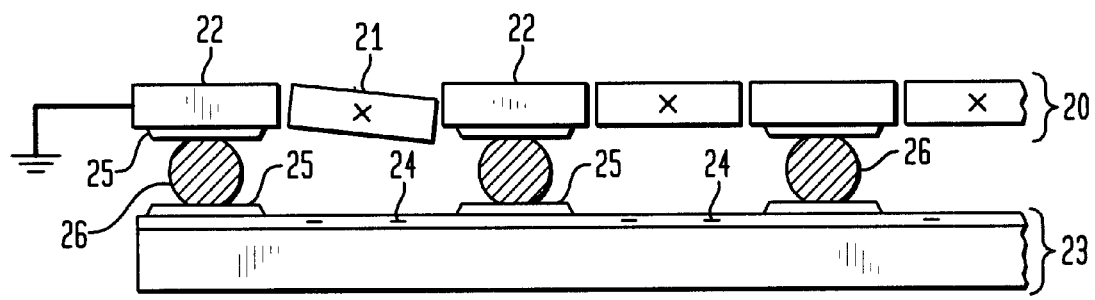
FIGS. 2(a) and 2(b) schematically illustrate a first embodiment of a solder bonded MEMs device.

Referring to the drawings, FIG. 2(a) illustrates an exemplary solder bonded MEMs device in accordance with the invention comprising a component layer 20 (here a mirror layer) including at least one component 21 (here a gimbaled mirror) movably coupled to the surrounding frame 22 and a mating actuator layer 23 including at least one actuator 24 (here an electrode) and leads (not shown) for applying voltage between actuator 24 and component 21. While the components of layer 21 will hereinafter be exemplified as mirrors, it should be understood that the components could be any of a wide variety of components such as gratings, variable thickness slabs, polarizers, chemical sensors, movement sensors or even mechanical paddles. And although actuator layer 23 is exemplified as an array of electrodes, the actuators can be other kinds of actuating devices for moving the components, such as controllable magnets.

Layers 20 and 23 are advantageously polysilicon or single crystal silicon. The mating surfaces of the layers are each provided with a plurality of wettable metallization regions 25 and solder ball bonds 26 between metallization regions 25. The layers are spaced apart by the solder balls 26. The component 21 can be a double-gimbaled, cantilevered mirror and is coupled to the frame structure 22 of layer 20 by torsion bars or springs (not shown). Hence the mirror 21 can be tilted to any desired orientation.

Each mirror 21 can be electrically grounded and tilted for optical signal routing via electrostatic actuation by one or more actuator electrodes 24 placed underneath the mirror. An exemplary desired size (effective diameter) of mirrors suitable for optical MEMs applications is in the range of 50–10000 $\mu$m, preferably in the range of 200–2000 $\mu$m. The mirrors can be coated with a reflecting metal layer comprising Au, Ag or Al. The use of other metals or alloys is not precluded.

The component layer 20 and the actuator layer 23 are solder bonded together with accurate lateral alignment and with accurate gap spacing. The component layer 20 typically comprises an array of components 21. The two-part structure is conveniently fabricated using a single-crystal silicon wafer fabrication process, although a polysilicon surface micro machining can also be used for providing the separate component and actuator parts. See the on aforementioned U.S. patent application Ser. No. 09/559,216 to Greywall now U.S. Pat. No. 6,201,631.

Figure 2B:
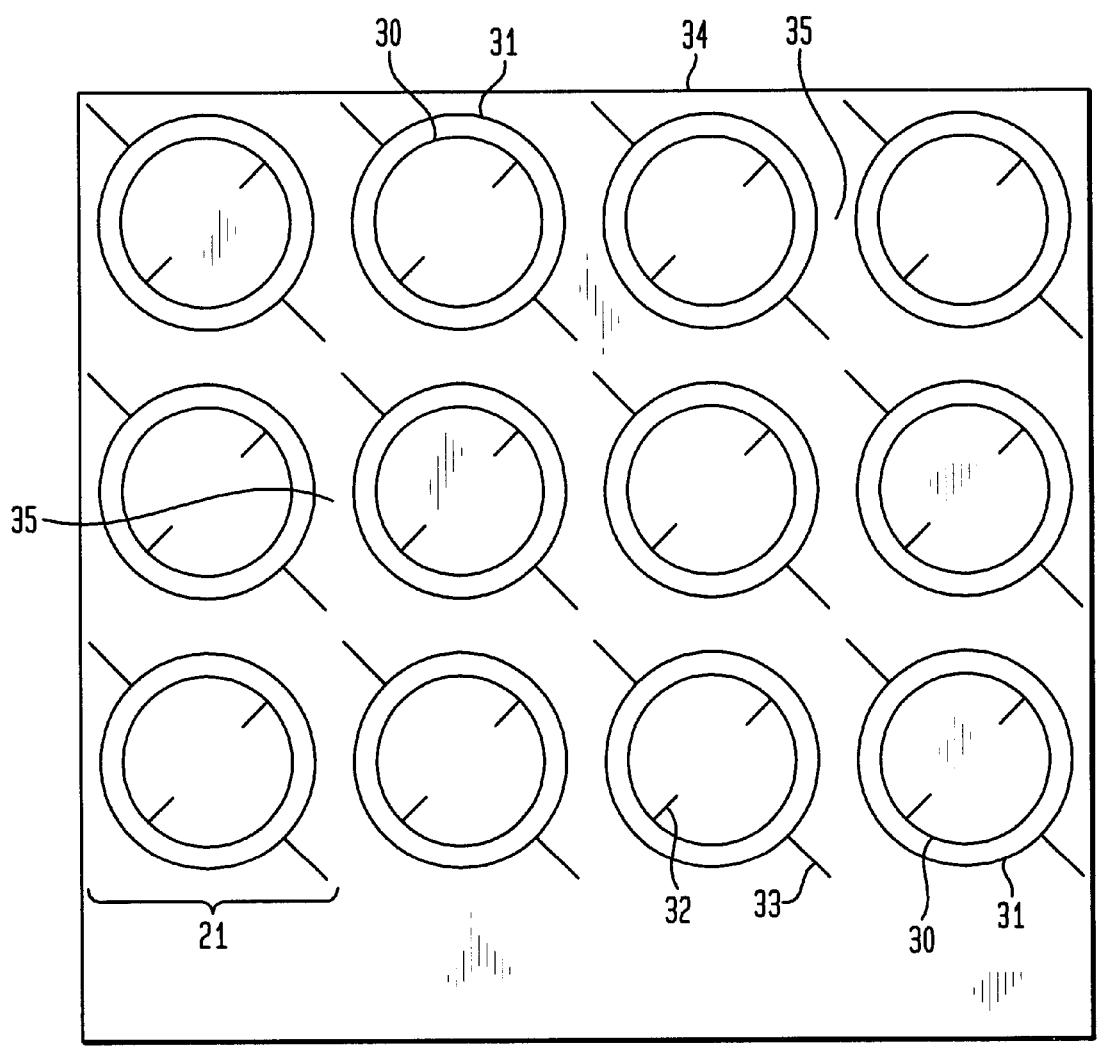

FIG. 2(b) illustrates a two-dimensional array of such movable, gimbaled mirrors 21. The mirror elements 30 are attached to gimbals 31 by torsion bars 32. The gimbals, in turn, are attached by torsion bars 33 to a frame 34. The mirrors can be patterned on a single layer of substrate, for example, an SOI (silicon-on-insulator) single crystal silicon wafer using conventional silicon fabrication processes such as lithographic patterning, chemical etching, or reactive ion etching. The open areas 35 between the gimbaled mirrors can be utilized to place solder bonds as shown in FIG. 2(a).

This solder bonded MEMs device has many processing and performance advantages as compared with conventional devices. The solder bonding, as shown herein, can provide highly accurate spacing of the gap between the layers 20, 23 and facilitate highly :accurate lateral alignment. Such a structure permits precise control of the components, a more robust structure, greater packing density, larger component sizes, and larger component rotation angles than are conventionally obtained and easier electrical connection.

Figure 3A:
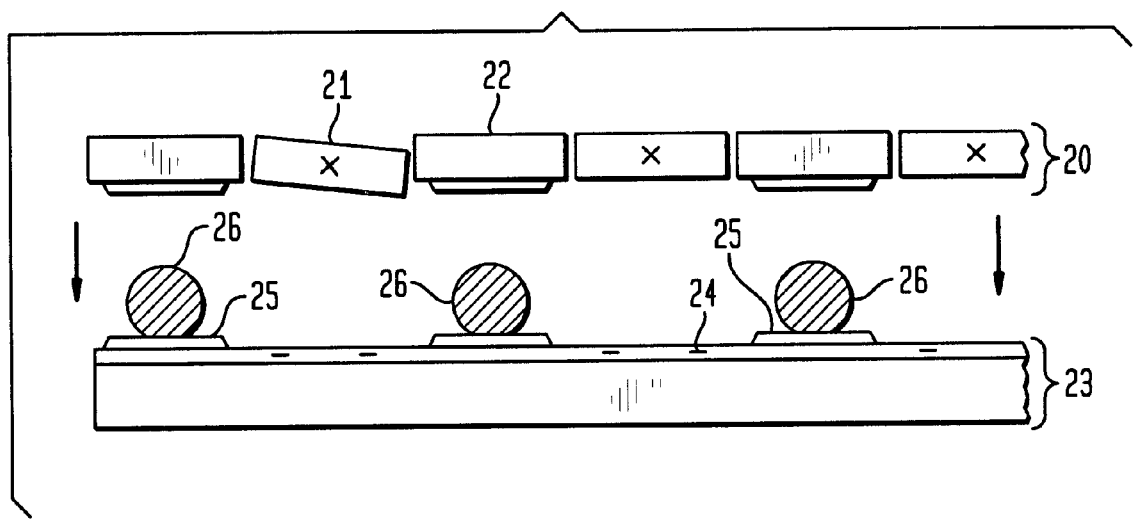
FIGS. 3(a) and 3(b) illustrate steps in a first method of fabricating the FIG. 2 device.
Figure 3B:
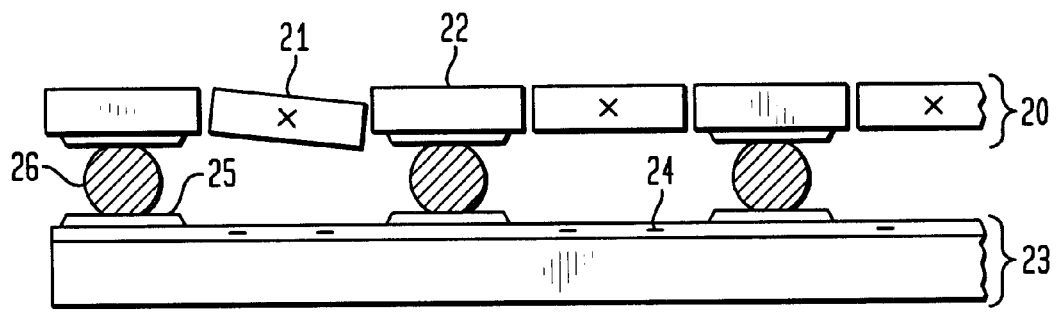

FIGS. 3(a) and 3(b) illustrate steps in assembly of the optical MEMS device shown in FIG. 2(a). The component layer 20 and the actuator layer 23 can be accurately laterally aligned, e.g., by using a micro aligner (not shown) for x-y positioning. The vertical gap can be accurately controlled, e.g., by using a z-axis position sensor and micro-positioner (not shown), optionally guided by camera vision sensor, or capacitive gap sensor. The solder bonding operation may be carried out while the pre-aligned lateral and vertical positions are held in position until the solder solidification is completed. The thermal contraction of solder joint height is desirably considered in determining the z-axis gap positioning.

The layers 20, 23 are typically comprised of solder non-wettable surfaces such as silicon, silicon oxide. In order to make these surfaces solderable, under bump metallization (UBM) coatings 25 are desirable. The UBM layers for the MEMS assembly advantageously comprise at least one adhesion layer such as Ti or Cr with an optional Cr—Cu gradient alloy layer, at least one solderable metal layer such as Cu or Ni, and at least one surface oxidation-resistant layer such as Au, Pd, Pt or Ag. The use of one or more diffusion barrier layers to prevent or minimize undesirable inter-layer metallurgical reactions is not precluded.

The preferred thickness of the adhesion layer is in the range of 2–500 nm, preferably 20–200 nm. The preferred thickness of the solderable layer is in the range of 50–5000 nm, preferably 100–1000 nm. The desired thickness of the oxidation-resistant protective layer is in the range of 10–500 nm, preferably 20–200 nm. The UBM coatings 25 are typically applied to the surfaces of both the component layer and the actuation layer facing each other, at locations between the components, Patterning of the UBM coating 25 can be done using known techniques such as lithography or deposition through shadow masks with desired pattern geometry.

The solder alloys may be applied onto the UBM surface as a paste, preform or deposited film, e.g., prepared by sputtering, evaporation, or electro deposition. The solder material is then reflowed (melted by heating) so as to form well defined, nearly spherical solder bumps 26 as shown in FIG. 3(a). The mirror layer, the actuator layer, or both contain these solder bumps.

The component and the actuator layers are brought together into contact and heated to produce solder joints and mechanically attach the two parts as shown in FIG. 3(b). A solder flux is optionally used to aid the soldering process. For the MEMS assembly, a vapor flux such as formic acid carried by nitrogen or argon gas is preferred over liquid flux that may get trapped in tiny gaps near the component or torsional hinge. Examples of solder alloys suitable for the inventive assembly of the two-part MEMS devices include 37%Pb—63%Sn (by weight) eutectic solder (with a melting point (m.p.) of ~183° C.), high-lead 95Pb—5Sn solder (m.p. ~308° C.), Sn—3.5Ag (m.p. ~221° C.), 57Bi—43Sn (m.p. ~139° C.), 95Sn—5Sb (m.p. ~245° C.), 49Sn—51In (m.p. ~137° C.), and 80Au—20Sn (m.p. ~280° C.).

The gap spacing between the component layer 20 and the actuator layer 23 is important for reproducible actuation of the MEMs components. As an alternative to mechanical positioning and soldering, the spacing may be controlled by careful selection of solder volume applied onto each UBM pad, the area of the pad, the weight applied over the top of the assembly during the soldering, and the temperature and time of soldering. Larger volume, smaller pad area, smaller weight applied, and lower soldering temperature all tend to produce taller solder joints. The solder joints so produced typically exhibit a truncated sphere shape.

One may approximate the relation between vertical gap spacing and solder volume by assuming that the solder joint has the form of a sphere of radius R truncated at the planes of contact with the metallization pads. In an exemplary device we may assume that the diameter of the circle of contact (plane of truncation) is approximately the height of the joint, then the joint height $h=\sqrt{2}R$. The joint height h can then be correlated to the volume of the truncated solder $(0.884 \times 4/3R^3)$ with a ratio $\sqrt{2}R/(3.701R^3)$. Thus by controlling the volume of the solder on the metallization pads, the joint height can be controlled. The soldering process onto mating pad areas has a self-aligning effect due to the surface tension of molten solder and the driving force to reduce the surface energy of the molten solder at the joint. The component layer above and the actuator layer below are thus pulled together while the mating pads are automatically laterally aligned. For even more accurate lateral alignment, supplemental mechanical alignment may optionally be employed, e.g., by utilizing alignment of notches, edges or corners against fixed-positioned notches or steps in the assembly.

The attainable accuracy in the vertical gap spacing in the inventive solder assembly is with less than 10% variation from the preferred nominal spacing, preferably with less than 5% variation, and even more preferably with less than 2.5% variation. For example, 600 $\mu$m diameter mirror components may operate with a mirror-electrode spacing of 60 $\mu$m. The attainable variation from this 60 $\mu$m spacing is less than 6 $\mu$m, preferable less than 3 $\mu$m, even more preferably less than 1.5 $\mu$m. The lateral alignment of component position vs. actuator position is also critical as a deviation from desired alignment may lead to an undesirable deviation in the intensity of electrostatic (or magnetic) actuation of the MEMS device. The attainable lateral alignment in the inventive, solder-packaged optical MEMS device is with an accuracy of within 5%, preferably within 1% of the effective component diameter. The effective component diameter of a non-circular component is the diameter of a circle having the same area as the component.

Figure 4A:
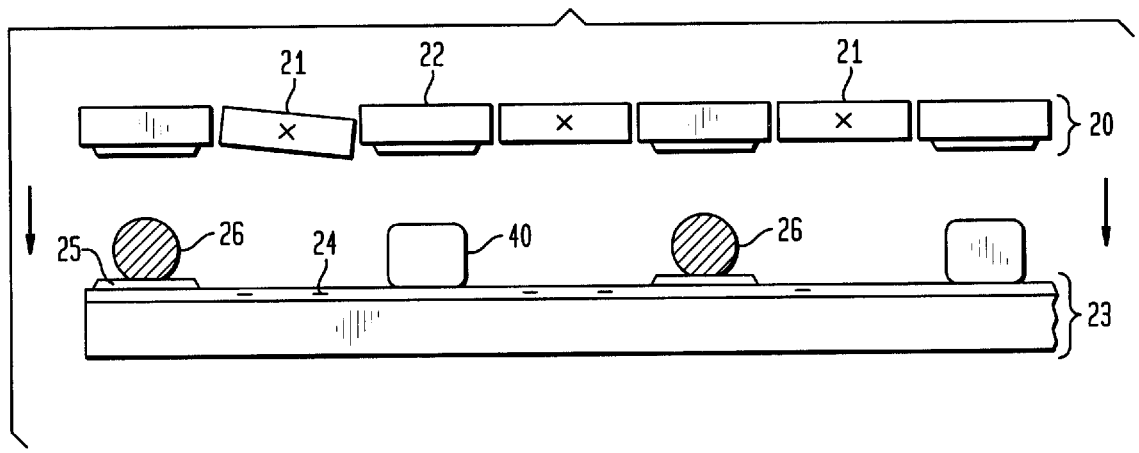
FIGS. 4(a), 4(b) and 4(c) illustrate steps in a second method of fabricating the device using a removable spacer.
Figure 4B:
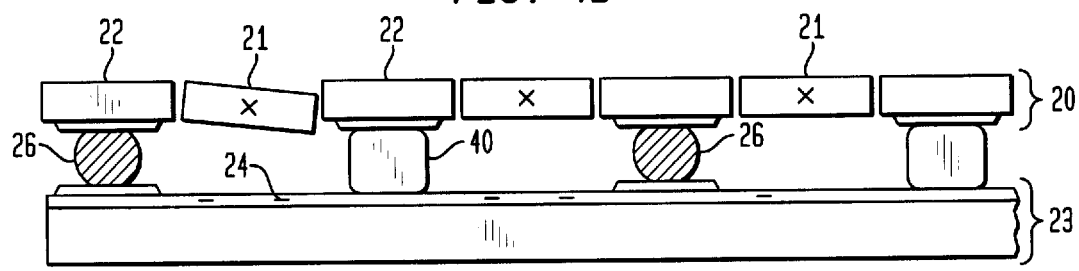
Figure 4C:
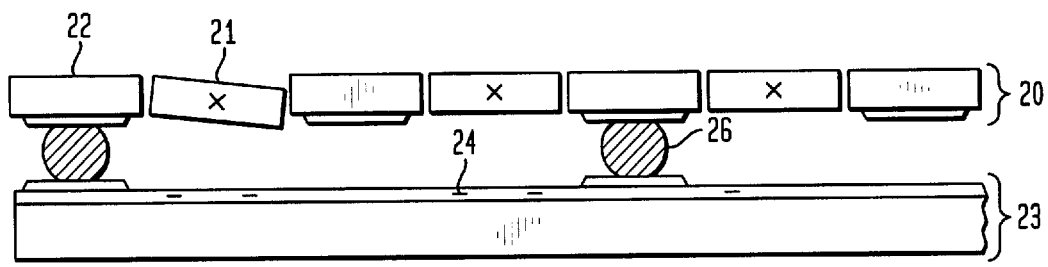

FIGS. 4(a), 4(b) and 4(c) schematically illustrate the use of a removable spacer 40 to further enhance the accuracy of the gap spacing in a solder-assembled, two-part optical MEMS device. With spacer 40, an accuracy of within 5%, preferably within 2.5% of a desired gap spacing can be obtained. In FIG. 4(a), the UBMs and solder bumps are provided on selected sites between components with certain regular or irregular intervals. A removable spacer assembly is prepared with a predetermined height (or thickness), desirably with less than 1% and preferably with less than 0.5% deviation from the target spacing.

FIG. 4(b) shows the component layer 20 laterally aligned with the actuator layer 23 and placed on the movable spacers 40 to provide accurate vertical spacing. The assembly is then heated to solder the layers 20, 23 together. After soldering, the removable spacers 40 are removed (physically or by etching), leaving the structure shown in FIG. 4(c).

Figure 5A:
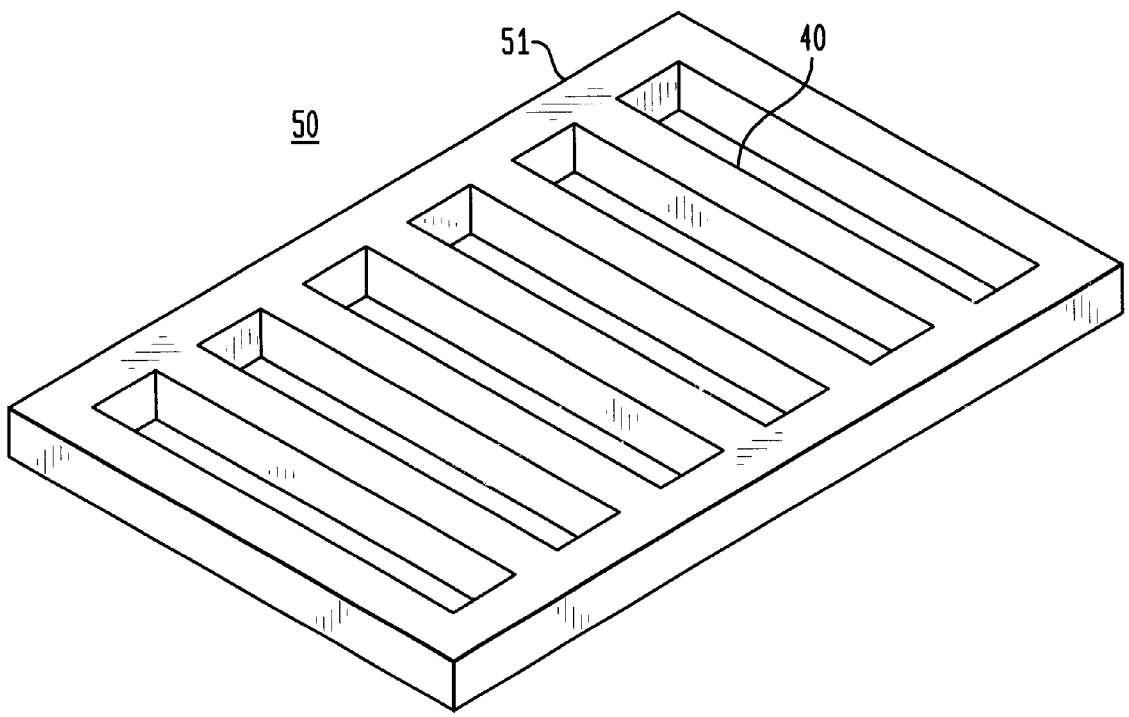
FIGS. 5(a) and 5(b) illustrate exemplary, removable spacers suitable for solder bond height control.
Figure 5B:
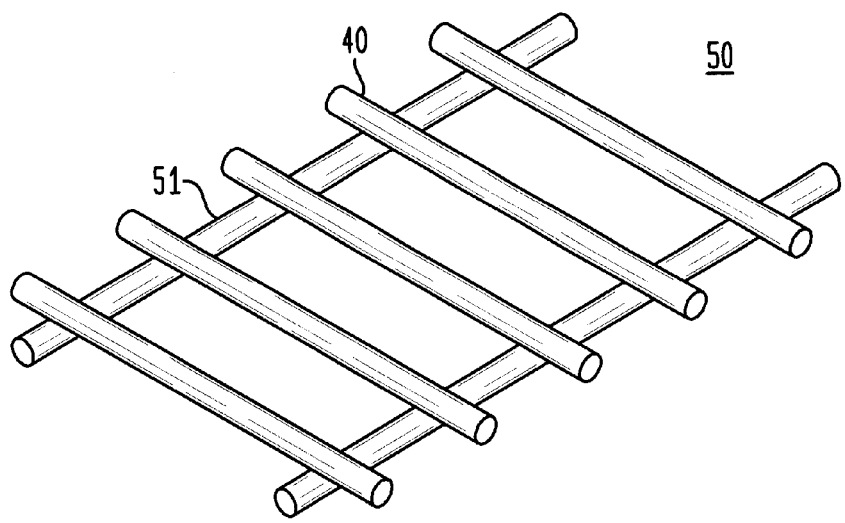

The removable spacer is preferably an assembly 50 of a periodic and parallel array of spacers 40. FIGS. 5(a) and 5(b) illustrate exemplary assemblies 50 with connecting ends 51. With such assemblies, a connecting end 51 can be cut and using the other connecting end, the spacers 40 can be pulled out in a linear fashion without disturbing any of the mechanically fragile components.

The spacer assembly 50 is placed over the actuator layer 23, which already contains solder bumps at specific sites. The location of each of the spacers 40 is selected in such a way that they do not overlap with the existing solder bumps. The component layer 20 is then placed above the removable spacer assembly, laterally aligned with respect to the actuator layer. Then the entire assembly is heated and solder bonded while a weight or pressure is optionally being applied so that the solder height turns out to be exactly the same as the spacer height. Even in the absence of the applied pressure, the solder surface tension can be utilized to vertically pull the component layer and the actuator layer closer until they both touch the removable spacer.

After the soldering operation, one edge of the spacer assembly is cut off, and the spacers are mechanically pulled out, leaving the final configuration of FIG. 4(c). Alternatively, although less preferable, the spacers can be chemically etched away or burned away if the spacer material is chosen such that the etching or burning process does not damage the components and actuators.

Solder alloys generally exhibit very high coefficient of thermal expansion (CTE), especially those containing a large percentage of Pb or In. The CTE values of solder alloys can be as high as $23-28 \times 10^{-6}$/degree C. as compared to $\sim 4 \times 10^{-6}$/degree C. for Si, $\sim 13 \times 10^{-6}$/degree C. for nickel, and $\sim 18 \times 10^{-6}$/degree C. for copper alloys. If the spacers of FIG. 4 have a much lower CTE value than the solder contracts, then the spacers advantageously should be removed after the soldering operation is completed. Repeated changes in temperature environment during service, storage or shipping of the packaged optical MEMS devices might otherwise result in a premature fatigue failure of the solder joints.

The solidification shrinkage combined with the generally greater thermal contraction of the solder joint material as compared to the thermal contraction of the spacer material may result in a trapping of the spacer. In order to allow an easy removal of the spacer by horizontal pull out without seriously disturbing or damaging the delicate mirror and associated structures, one or more of the following approaches can be utilized.

1. The spacer can be made up of round or oval wires with minimal contact with the upper mirror layer and the lower electrode layer for reduced friction. It can also be coated with low-friction material such as fluorocarbon, diamond or diamond-like-carbon so that the mechanical pulling out of the spacer becomes easier.
2. The spacer can be made of a round tube material with a hollow core instead of solid wire material so that the spacer material has some vertical compliancy and is more easily removed by horizontal pulling.
3. The spacer can be made of fine metallic tubes with a round or preferably an oval cross section into which finer, round wires are inserted. When the soldering operation is completed, the inner round wires are pulled out first, which will then make the tube collapse into an oval shape with less height than the solder joint height. This allows easy removal of the remaining spacer frame material.
4. The material used for the spacer can be selected so that it has higher CTE value than the solder material used, and of course substantially higher melting point than that for the solder. On cooling to room temperature (or to even below room temperature if necessary) after soldering operation, the spacer then thermally contracts more than the solder joint height, loosens, and is easily removed. The desired CTE value for such thermal-contraction-removable spacer material is at least 10% higher, preferably at least 25% higher than the CTE of the particular solder used for the packaging. For example, an aluminum based alloy spacer with a CTE of $\sim 23 \times 10^{-6}$/degree C. can be utilized if the solder used is 57% Bi—43% Sn eutectic solder with the CTE of $\sim 17.5 \times 10^{-6}$/degree C., a magnesium-based alloy spacer with CTE values of $\sim 26 \times 10^{-6}$/degree C. can be utilized if the solder used is Sn—3.5%Ag eutectic with a CTE of $23 \times 10^{-6}$/degree C., and a Zn—1% Cu alloy spacer with a CTE of $\sim 35 \times 10^{-6}$/degree C. may be utilized if 37Pb—63Sn eutectic solder with a CTE of $\sim 25 \times 10^{-6}$/degree C. is used. The Bi—Sn solders with high Bi contents have a unique and advantageous behavior of expanding upon solidification thus making the removal of the spacer easier. The desired high CTE spacer material does not have to be restricted to metallic materials. For example, a spacer of the type shown in FIG. 5(a) or 5(b) may be made of a polyimide, thermosetting epoxy or other plastic material which remains stable at the typical soldering temperature of 100–300° C., and exhibit high CTE of often greater than $50 \times 10^{-6}$/degree C. and consequently a large thermal contraction, thus allowing easy removal of the spacer after soldering operation.
5. The spacer can be made of a shape memory alloy such as the equi-atomic Ni—Ti alloy, and alloys in general which undergo phase transformation and associated volume change near room temperature heating and cooling. The cross section of the wire part of the shape memory spacer is made to have a collapsed oval shape at room temperature, which is converted to a taller cross section by phase transformation when heated to the soldering temperature, which then returns to the original lower height when cooled back to room temperature. This allows easy removal from the solder-bonded optical MEMS package.

Figure 6A:
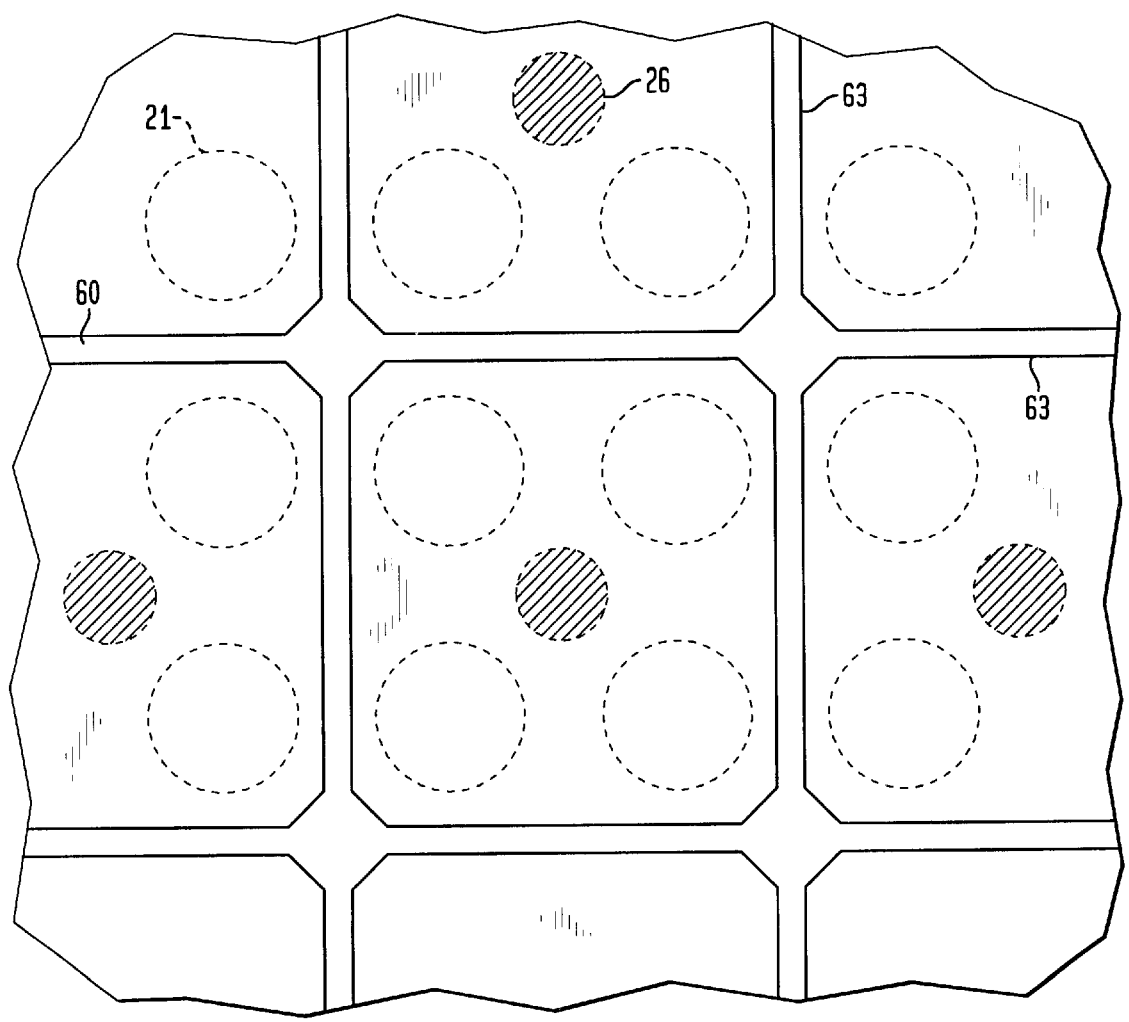
FIGS. 6(a) and 6(b) illustrate fabricating a MEMs device incorporating a permanent spacer.
Figure 6B:
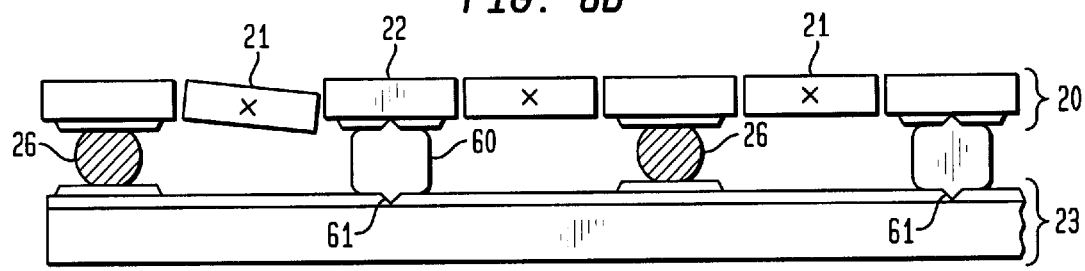

FIGS. 6(a) and 6(b) illustrate an alternative embodiment of the invention where the gap-defining spacer is a permanent drop-in spacer 60 which is permanently left inside the solder-bonded optical MEMS package. In this case, the coefficients of thermal expansion (CTEs) of the spacer material and the solder material are carefully matched. Conveniently, the permanent spacer 60 is dropped into the gap and laterally aligned just prior to the soldering operation, and the spacer removal step can be omitted. Advantageously, the actuator layer 23 can be provided with notches 61 to facilitate lateral alignment of the spacer 60.

An important and preferred configuration of a drop-in (permanent) spacer 60 provides aerodynamic isolation for one or more components in the array. The movement of one mirror, for example, electrostatically actuated tilting for optical signal re-routing, can disturb or cause the movement of adjacent mirrors. The drop-in spacer is preferably configured to provide walls 63 so that the boundary area between adjacent components is partitioned or blocked as much as possible. Blockage may be defined as the proportion of the 360° periphery underlying a component that is blocked off by the spacer. The preferred blockage is on the average, with at least 20%, preferably 50%, even more preferably 80% of the total peripheral boundary area. After solidification of the bonding solder, the gap spacing between the component layer and the electrode layer is dictated by the pre-set thickness of the drop-in spacer. The relative adjustment of CTE values of the spacer and the solder by suitable materials selection in combination with the consideration of solidification shrinkage or expansion involved can be utilized to lock the spacer in place as shown in FIG. 6(b), yet without excessive stresses, especially tensile stresses, induced into the solder joints.

A spacer useful for the structure of FIG. 6 can be made of elemental metals, alloys, ceramics, silicon or polymer. The CTE matching of the permanent drop-in spacer to that of the solder used is important in avoiding fatigue failure of solder joints on thermal cycling caused by ambient temperature changes or assembly/test process. In the inventive solder-packaged optical MEMS device, the CTE of the spacer material is preferably closely matched with that of the solder, with the difference being desirably less than 20%, preferably less than 10%, even more preferably less than 5% of the solder CTE. For example, if the solder used is the 37Pb—63Sn eutectic solder with a CTE of ~$25 \times 10^{-6}$/degree C., the spacer material can be made of aluminum with a CTE of $23.6 \times 10^{-6}$/degree C. or a magnesium alloy (Mg—9% Al—1% Zn) with a CTE of $26.1 \times 10^{-6}$/degree C. In general, alloy compositions containing Al, Zn, Mg, Pb, In, or Cu can be made to exhibit CTE values comparable to those of the commonly used solder alloys.

Figure 7A:
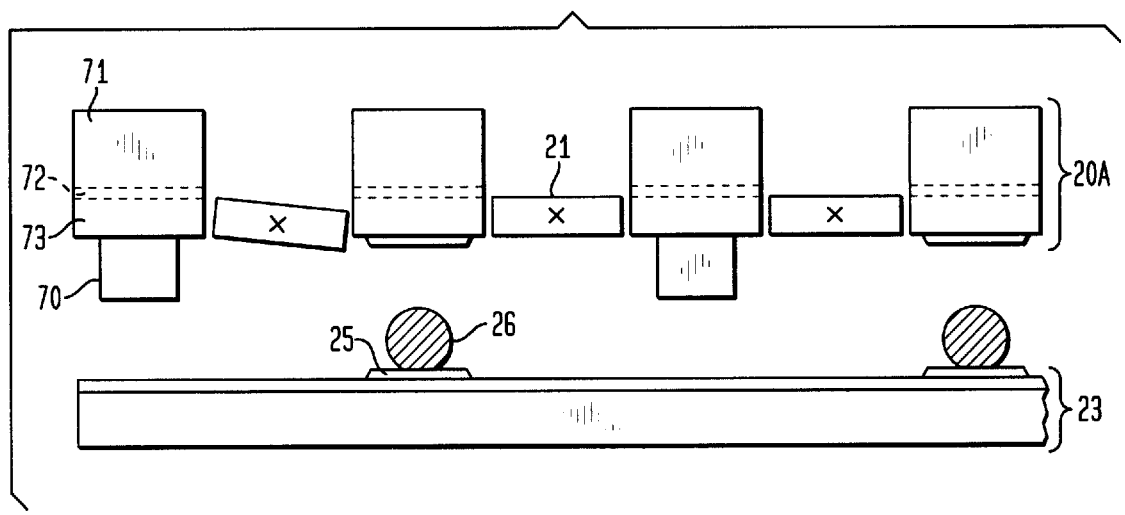
FIGS. 7(a) and (b) schematically illustrate two exemplary embodiments of the MEMS device according to the invention.

Alternatively, the spacer can be locked in place before the soldering operation by fixturing or attaching onto part of the overall device structure. FIG. 7(a) illustrates an embodiment of the invention wherein a pre-attached spacer 70 is patterned and bonded onto one of the mating parts, e.g., either on the mirror layer or the actuator layer. These spacers are to be permanently left in the packaged structure. The pre-attached spacers 70 are desirably configured so that the boundary area between adjacent mirrors is compartmented or blocked as much as possible. The preferred blockage is on the average, with at least 20%, preferably 50%, even more preferably 80% of the total boundary wall area. The solder bumps are separately added for bonding purpose. The spacer thickness again accurately defines the gap spacing between the mirror and the electrode during the soldering operation. The preferred accuracy of these pre-attached spacers is within less than 5%, more preferably less than 2.5% deviation from the desired gap spacing. The pre-attached spacer 70 can be made of metal, silicon, ceramic, polyimide or plastic material. Plastic materials tend to outgas in a hermetically sealed atmosphere, and also have generally higher CTE values, thus are less preferred than inorganic materials such as metals, ceramics or silicon materials.

In FIG. 7(a), the mating faces of the component layer 20A and the actuator layer 23 are both in planar configuration, and the spacer is added after the component layer 20 with movable components 21 is fabricated. The movable component mirrors are preferably made of silicon that is typically only several micrometers thick. In this embodiment the component layer 20A is fabricated on a silicon-on-insulator substrate comprising a first layer of silicon 71, a layer of insulator 72 (typically $SiO_2$) and a second layer of silicon 73. A thin silicon mirror component can be made using the well-known silicon-on-insulator (SOI) fabrication process. The SOI process permits convenient fabrication of thin silicon mirrors 21, and the presence of the buried oxide layer 72 is useful as an etch-stop barrier. In FIG. 7(a), selected patterned areas of the upper portion 73 of the SOI substrate 20A are etched, e.g., by using chemical etch, reactive-ion etch, or a combination of these processes to form the component array. The gimbals and the torsion bars (not shown) can be formed around each component. The SOI material and process are described, for example, in Concise *Encyclopedia of Semiconducting Materials and Related Technologies,* Edited by S. Mahajan and L. C. Kimmerling, Pergamon Press, New York, 1992, p. 466.

Since the movable component is typically thin and fragile with about 1–10 micrometer thickness for the ease of movement, the component layer substrate base (layer 71) which carries the components is advantageously made substantially thicker than the component membrane to provide mechanical stability to the structure. The desired thickness of the SOI substrate for MEMS mirror applications is typically in the range of 50–1000 micrometers and preferably 200–500 micrometers. In the exemplary embodiment of FIG. 7(a), the SOI material is etched in such a way that the patterned thicker portion of the component-carrying substrate (layer 71) is facing up, while the smooth surfaced portion (layer 73) is facing down toward the actuator layer 23. In this embodiment, a mirror component can be formed on the layer of silicon proximal the actuation layer 23.

Figure 7B:
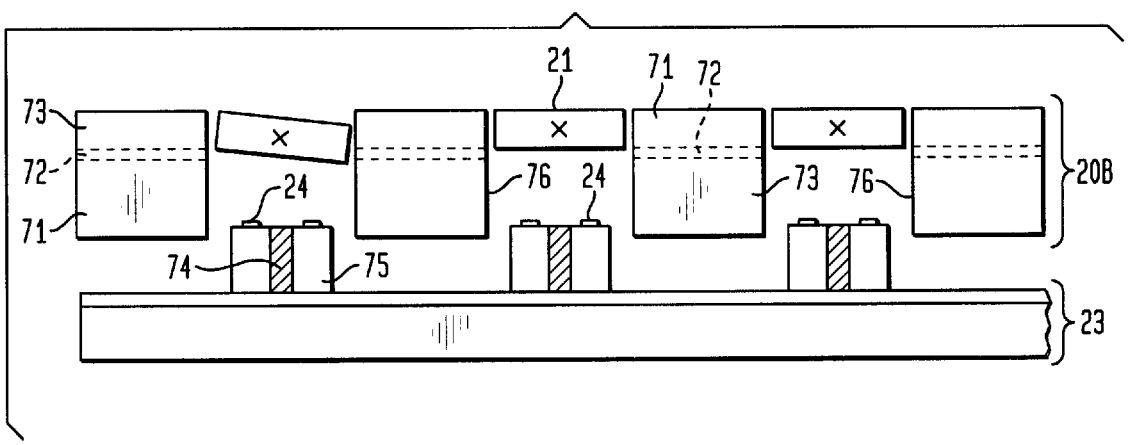

In an alternative embodiment illustrated in FIG. 7(b), the component-carrying SOI substrate 20B is turned upside-down so that the thicker portion 71 of the substrate 20B is conveniently utilized as an inherent (pre-formed) spacer. A mirror component is formed on the layer of silicon distal from the actuation layer, and the layer of silicon proximal the actuation layer is configured to at least partially enclose the region underlying the mirror between the mirror and the actuation layer. Since the typically preferred thickness of the. mirror-carrying substrate is at least 200 micrometers for mechanical sturdiness, this gap may be too large for easy, low-voltage electrostatic operation of MEMS mirrors. The actuator electrodes 24 are advantageously raised, so that relatively low voltage operation is possible. Such elevation can be achieved by deposition of polysilicon, glass, metal or composite material base by chemical vapor deposition, physical vapor deposition, or electrochemical deposition.

One way of making such electrical connections to the raised electrodes is to use via holes 74 in combination with mesas 75 fabricated by silicon processing. The protruding mesa 75 can be made to fit into a cylindrical cavity that is part of the spacer wall structure. The vertical via holes 74 are metallized with metallic thin film deposition, polysilicon deposition, or with conductive polymer composite fillers. The via holes are electrically connected to underlying conducting electrical interconnection wires (usually thin film aluminum lines) which are connected to a power supply source (not shown).

Figure 8A:
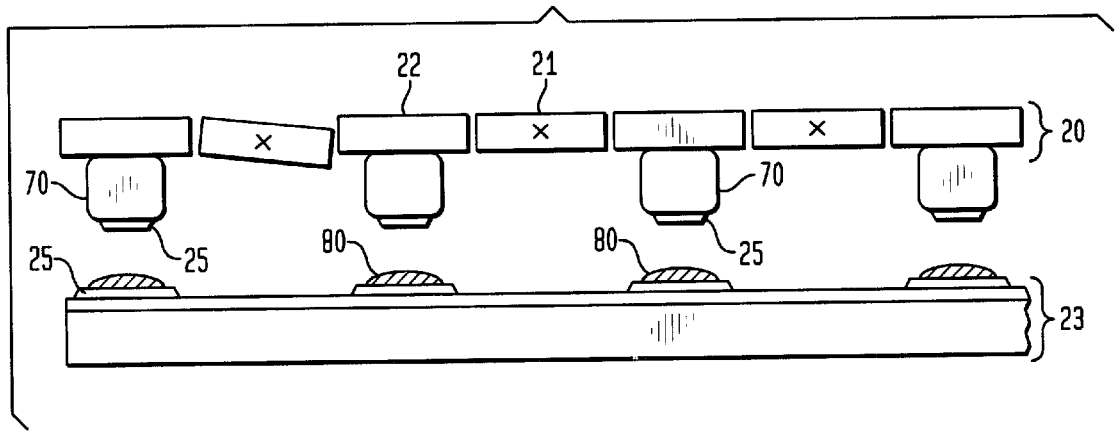
FIGS. 8(a) and 8(b) illustrate additional examples of MEMS devices using spacers.

The device of FIG. 7(b) is particularly useful for the following reasons: 1) enclosing spacer walls 76 prevent or minimize the aerodynamic cross talk between adjacent components. 2) The silicon walls 76 proximal the actuation layer can be p-type or n-type doped, or coated with conducting material to reduce or eliminate electrostatic cross-talk and thereby electrostatically shield components. 3) Since the upper surface of the mirror component is flat with no protruding substrate portion, there is no significant anomalous light reflection from the corners or walls of protruding portions. 4) The required electrical grounding of the mirror layer and the spacer layer is easily done, and 5) the spacer can be easily bonded to the actuator layer either by using solder joints (such as illustrated in FIG. 7(a)) or by using thin solder joints (such as illustrated in FIG. 8(a)).

Yet another alternative embodiment of using the inherent spacer as a part of the base MEMS structure is to produce the spacer on the actuator layer instead of the component layer. This can be accomplished by carrying out the silicon etch and patterning process on the actuator layer in such a way that a protruding silicon spacer of desired thickness, either as isolated islands or as a continuous walls, is present on the top surface of the actuator layer.

The use of electrically conducting spacers, e.g. made of metals or polysilicon, is usefuil in avoiding electrostatic cross talk between neighboring components, especially in high-density mirror array designs. In such devices where the adjacent components are placed close to each other, the actuating electrostatic field from the electrodes can inadvertently affect the movement of the adjacent components. In a preferred embodiment the spacers are made of highly conductive material so that they block the applied electric field from reaching the neighboring components (e.g. mirrors or gimbals). The desired electrical resistivity of the spacer material is less than 1 ohm-cm, preferably less than 1000 micro-ohm-cm, and even more preferably less than 100 micro-ohm-cm. It is further desirable to have the spacer essentially completely surrounding the cavity under the mirror so that aerodynamic shielding and electrostatic shielding are achieved simultaneously. The desired coverage of the wall area in the inventive combined aerodynamic/electrostatic shield is at least 20%, preferably at least 50%, even more preferably at least 90% of the total peripheral boundary area between the adjacent mirror regions.

Metallic spacers such as Cu, Ni, Fe, Au, Pd, W and their alloys can be electroplated, evaporation deposited, or CVD (chemical vapor deposition) deposited, and then patterned into a desired configuration. For electro deposition, the selective sites on the surface of the substrate have to be made electrically conductive by metallization or electroless coating of conductive seed layers. Polysilicon spacers as thick as ~100 $\mu$m can be deposited, for example, by chemical vapor deposition process. The CTE mismatch between the spacer and the solder material should be kept in mind in designing and fabricating the MEMS solder packages. If the CTE mismatch is substantial, the temperature environment may have to more actively controlled so as to reduce the temperature excursion that the solder-packaged MEMS device experiences.

FIG. 8(a) illustrates an alternative embodiment utilizing a pre-attached spacer 70 but with minimized risk of CTE mismatch problems. This embodiment uses thin solder layer 80 placed directly under the spacer sites. UBM coatings are needed on the mating surfaces. Thin solder bonds while the spacer 70 sets the gap spacing accurately.

Figure 8B:
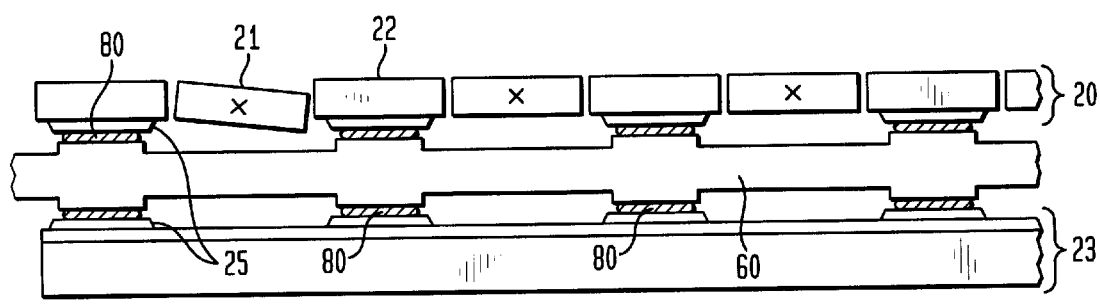

FIG. 8(b) illustrates another variation of assembly. Here, a thin solder region 80 is applied above as well as below a drop-in spacer or 60. The thin solder can be pre-coated or pre-deposited either on the surfaces of the drop-in spacer or on the surface of the mirror layer or the actuator layer.

Yet another pre-attached spacer is composed of protruding features in the silicon substrate layer itself. For example, the spacer can comprise protruding silicon features from the bottom of the component layer (as illustrated in FIG. 7) or alternatively the features can protrude from the top of the actuator layer. Preferably these protruding features also serve as aerodynamic and electrostatic isolators. Therefore, the term "pre-attached spacer" as used herein is broadly used to include such protruding features.

FIG. 9 schematically illustrates an alternative MEMs device including a protective stiffener frame 90 placed over the component layer 20. The stiffener frame 90 is desirably made of easily formable or machineable metal or alloy. It preferably includes alignment features 91. A spacer 94 can be disposed between layers 20 and 23 and provide cavities 28 between movable components 25 and their respective actuators on layer 22. Preferably the cavities 28 have conductive walls 29 and provide both aerodynamic and electrostatic isolation.

The frame 90 advantageously has a CTE not significantly different from that of the MEMS base material. The frame may be made as a single piece or may be composed of two parts, e.g., a thicker and stronger upper portion welded onto a thinner and more resilient sidewall portion 92 bonded onto the surface of the actuator layer 23. In order to reduce the exposure of temperature-sensitive MEMS components, the bonding process is preferably carried out with local heating near the bond areas 93, e.g., as by using laser soldering. In order to enhance solder wetting, the surface of the bonding areas may optionally be pre-coated with metallization layers such as Cr/Cu/Au.

The resilience provided by the elastically compliant sidewall 92 conveniently accommodates variations in the height of the metal frame or the heights of MEMs components and ensures tight elastic assembly without excessive force. The capable range of the vertical height variation accommodated by the resilience is at least 5 $\mu$m and preferably at least 20 $\mu$m.

The component layer 20 and the actuator layer 23 (with the spacer 94 between them) can be bonded together with accurate lateral alignment and accurate gap spacing by solder bonding. Alternatively, the component layer and actuator layer can be fusion bonded or adhesively bonded, as by glass frit bonding, or polymer-based adhesive such as epoxy or polyamide. Another alternative is to package together the component layer 20, the spacer 94 and the actuator layer 23 by magnets coupled to the component layer and the actuator as described in U. S. patent application Ser. No. 09/731,493 filed by Jin et al. on Dec. 7, 2000 and entitled "Magnetically Packaged Optical MEMS Device" which is incorporated herein by reference.

Instead of solder or adhesives, mechanical riveting may be used. For example, pins of soft metal (such as aluminum, gold, copper, or indium and their alloys) may be pre-attached onto the component layer 20 at cutout hole locations by brazing, soldering, welding or screwing down. The metal frame 90 with sidewalls 92 containing cut-out holes are then aligned and lowered so that the soft metal pins are placed in the cut-out holes. A picture-frame shaped pressing die can then lowered onto the pins, to flatten them so that they are spread laterally and permanently locked into place around the cutout holes. Depending on the nature of the metal frame material and surface cleanness, the flattened metal may even be cold-weld bonded onto the frame material around the cutout holes. This riveting process is advantageously carried out at ambient temperature, although the use of warm pressing, e.g., at ~50–90° C., is not excluded.

Figure 10:
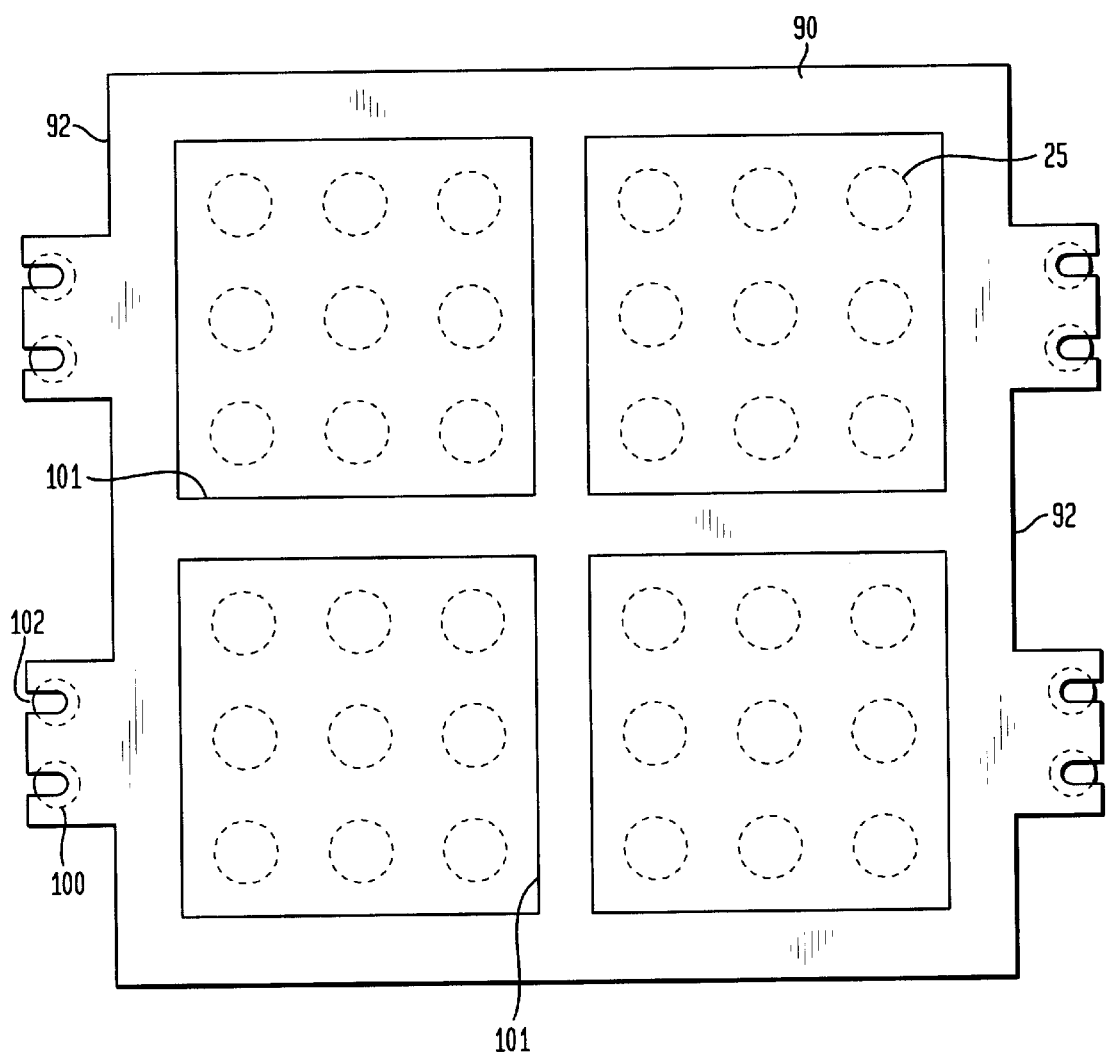
FIG. 10 shows a MEMs device including a transparent window.

FIG. 10 is a top view of a MEMs device employing a stiffener frame 90 wherein localized areas or spots 100 of the sidewall 92 are bonded onto the actuator layer 23, as by laser soldering. The stiffener frame transfers the load uniformly onto the whole MEMs device. A stiffener frame covering only the outside edges of the mirror layer may be sufficient in some applications to provide relatively uniform compression of the component layer, especially if the component-bearing substrate is rigid enough (e.g. greater than 100 $\mu$m in thickness). If there is room, however, it is preferred to have the stiffener configured so that some interior portion of the component layer is also pressed by the stiffener to further ensure the uniform compression. In FIG. 10 the center cross members 101 serve this purpose. The bottom end portion of the sidewall 92 may contain cutout holes or grooves 102 so that the solder joint is more securely positioned.

A portion of the stiffener frame 92 can also include one or more plates or windows of optically transparent material such as quartz plate, glass, diamond sheet, sapphire, or LiNbO$_3$. The desired thickness of the stiffener plate is at least 50 $\mu$m, preferably at least 250 $\mu$m. The presence of the transparent plates makes the compressive stress applied on, to the MEMS assembly more uniform and also protects the fragile MEMS device during handling or subsequent processing.

Figure 11:
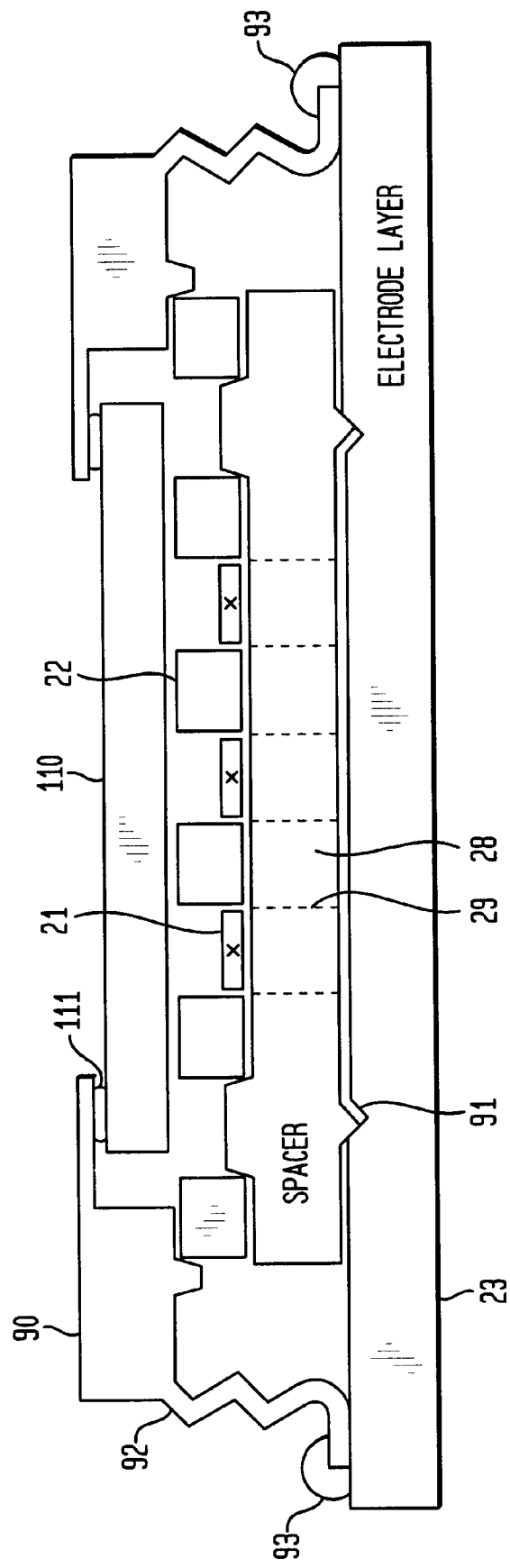
FIG. 11 illustrates a MEMs device including a preexisting spacer.

FIG. 11 shows such an alternative embodiment wherein the stiffener frame 90 includes a transparent window 110 for optical communication. The window 110 can be permanently and hermetically bonded to the metal frame 90 as by glass-to-metal brazing 111. This bonding is done prior to the MEMS assembly. The bonded frame/window structure, in the shape of upside-down box with resilient side walls, is placed over the MEMS stack, and the side walls are bonded to the actuator layer as by soldering, glass frit bonding, epoxy bonding, anodic bonding, mechanical spring assembly or riveting. The bonding process, if carried out all the way around the periphery, produces a hermetically sealed MEMS package. The sealed MEMS devices are well protected so that they are easily diced into individual devices, e.g., from, an 8" actuator wafer, with minimal contamination or damage to the fragile MEMS structures. The optical windows 110 are preferably anti-reflection coated, and preferably have a slightly non-parallel top vs. bottom surfaces to avoid loss of entering light beam signals.

The solder-packaged optical MEMS device with accurate mirror-electrode spacing is useful as a reliable optical channel cross connect for signal re-routing or signal; modification in an optical communication system. In a cross connect similar to FIG. 1(b), each mirror of a MEMs device described herein receives an optical signal from an input fiber and reflects it toward an intended output fiber.

Figure 12:
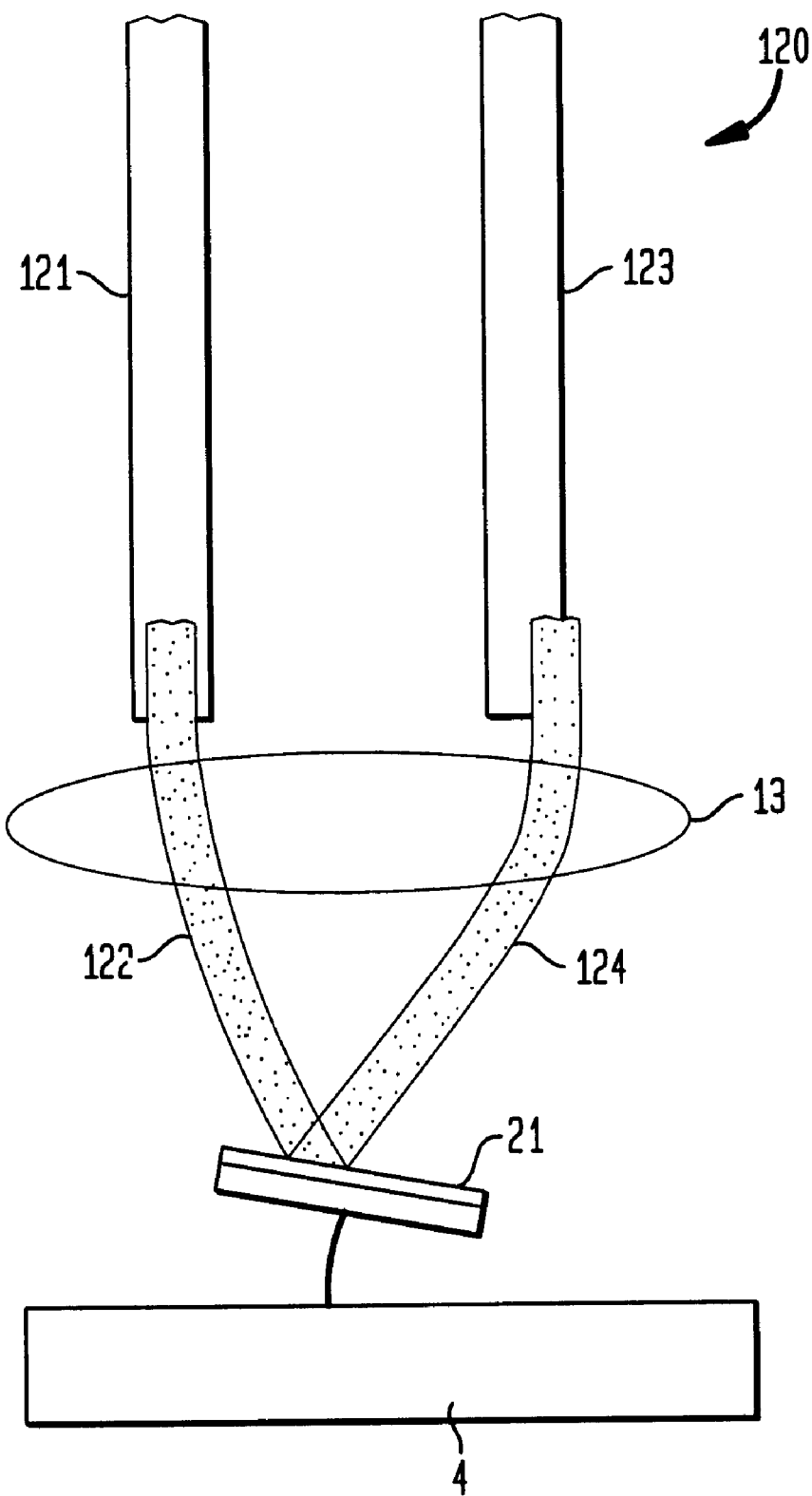
FIG. 12 schematically illustrates a variable attenuator comprising the optical MEMS structure according to the invention.

The inventive device is also useful for various other light-reflecting mirror systems such as power equalizers, variable attenuators, optical add/drop and switches. FIG. 12 illustrates a variable attenuator 120 using the common principle upon which such systems are based. Assume that an input fiber 121 transmits an input signal 122 to be attenuated and sent to output fiber 123. Then controllable mirror 21 is positioned for receiving signal 122 and is oriented for reflecting the signal so that only a portion of the reflected signal 124 enters the output fiber 123. Fine control of the mirror orientation permitted by the accurate spacing and alignment of solder bonding assembly permits fine control of the degree of attenuation. Thus the solder-bonded devices and arrays described hereinabove can be used as variable attenuators, optical switches, add/drop switches, and power equalizers.

Figure 1A:
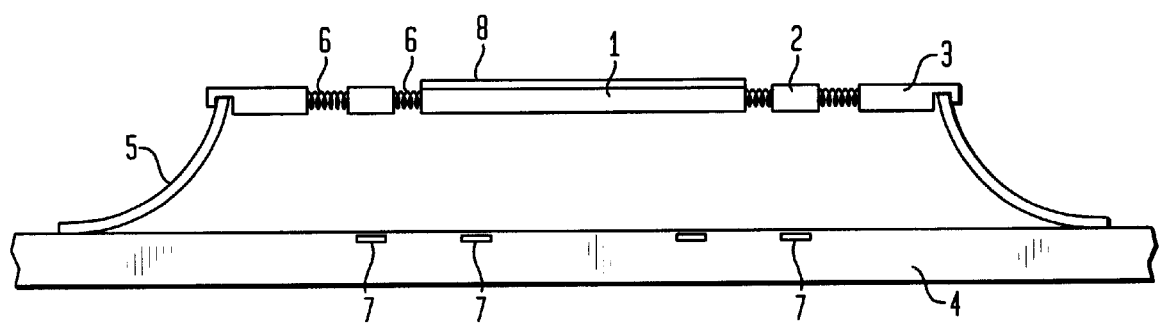
FIGS. 1(a) and 1(b) illustrate conventional MEMs devices and their application.
Figure 1B:
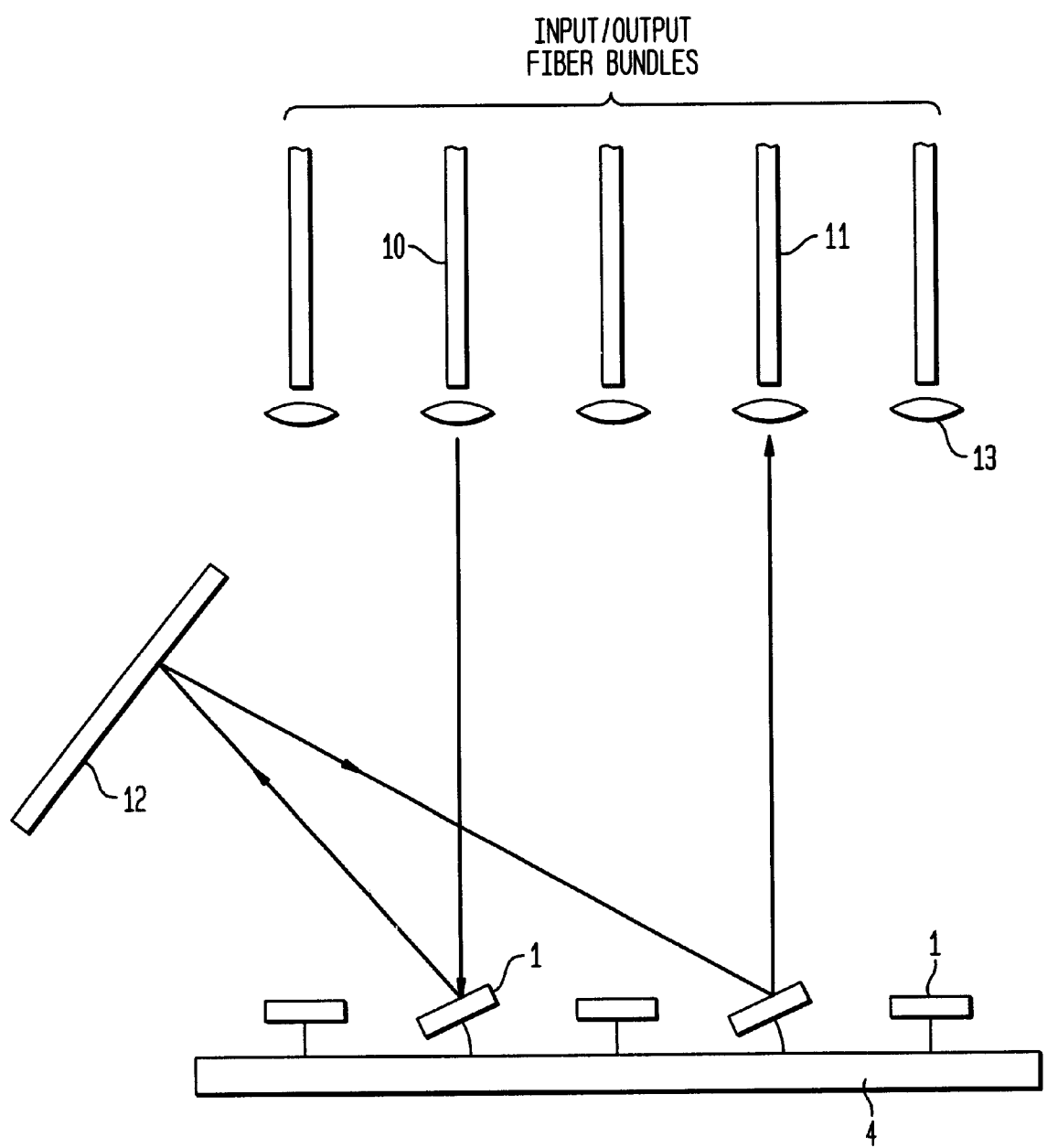

For a switch or an add/drop switch, in an arrangement similar to FIG. 1(b), the mirror for a channel to be switched off, dropped or rerouted is oriented to reflect the input signal to a different output fiber or to no output fiber, as desired. Hence the signal is rerouted, dropped or switched off. A channel is readily added to an output fiber by a mirror reoriented to reflect a new input to the output.

An important application relates to power equalization in optical fiber amplifiers. By way of background, multi-wavelength optical communication systems require reconfiguration and reallocation of wavelengths among the various nodes of a network depending on user requirements, e.g., with programmable add/drop elements. One problem limiting the capacity of such systems is that the erbium-doped fiber amplifier, which is often a necessary component in optical communication systems, has a characteristic spectral dependence providing different gain for different wavelength channels. This spectral dependence poses a problem for multichannel WDM systems, because different gains for different channels lead to high bit error rates in some of the channels. As the number of channels passing through the amplifier changes by channel add/drop reconfiguration, the amplifier will show deleterious peaks in its gain spectrum at some wavelength channels, requiring modification of the signal spectrum and flattening of the amplifier gains.

A novel dynamic gain equalizer is based on optical MEMS devices with convenient and reliable packaging and improved accuracy of mirror-electrode spacing. The optical signal gain in each wavelength channel can be independently (and simultaneously with other channels) controlled by the MEMS optical mirror, which reflects that particular signal. The mirrors in this case do not have to be tiltable in all orientations. A simple bending of a cantilever beam structure, desirably with a light-reflecting metal surface, can serve the purpose of gain equalizing. In addition, the mirrors do not have to be in circular shape. They can be square, rectangular, or of any elongated shape. The multiplexed optical is demultiplexed using suitable demultiplexers such as planar waveguides or thin film devices, with each of the separated wavelength channel signal being sent to each MEMS mirror and reflected. By programmably selecting the tilt (or bend) angle of relevant mirrors slightly off the angle of maximum signal reflection, the losses for various channels can be intentionally increased to different degrees for the purpose of gain equalizing. The stability of mirror operation enhanced by the inventive solder-packaged two-part optical MEMS devices is crucial in ensuring the accuracy of dynamic gain control by different mirrors.

Figure 13:
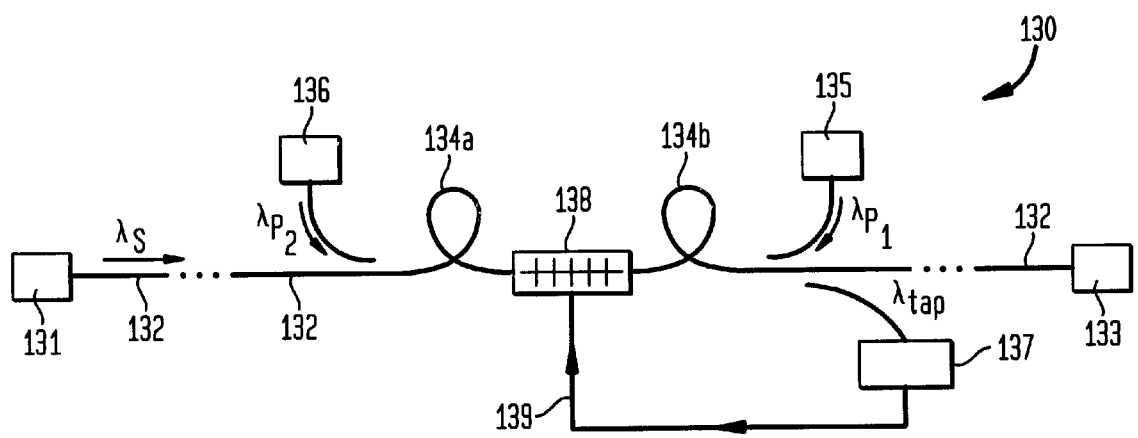
FIG. 13 schematically illustrates an optical communication system comprising a dynamic gain equalizer based on optical MEMS device according to the invention.

Referring to the drawings, FIG. 13 schematically illustrates an exemplary optical communication system using a solder-packaged MEMS mirror structure as a gain equalizer. The system 130 comprises dynamically gain-equalized optical amplifiers, a reconfigurable MEMS mirror spectral shaping device, and a feedback device. Specifically, the system 130 comprises a transmitter source 131 of optical signals such as a digitally modulated 1.55 $\mu$m signal, an optical signal path comprising a length of optical fiber 132 for transmitting the signal, and a receiver 133 for receiving and demodulating the signal. One or more optical amplifiers, such as erbiumdoped fiber amplifiers 134a, 134b, are disposed in the optical signal path for amplifying the transmitted signal. The amplifiers are pumped by pump sources 135, 136, of optical energy of pump wavelengths $_{p1}$ and $_{p2}$.

One of the preferred uses of the device of FIG. 13 is to reduce spectral dependence in the gain output of an optical amplifier. For example, the characteristic gain spectrum of an erbium-doped optical fiber amplifier has a pair of gain peaks at about 1.53 $\mu$m and at about 1.56 $\mu$m. Thus, a signal at 1.53 $\mu$m will be amplified more than one at 1.54 $\mu$m, which would be disadvantageous in a wavelength division multiplexing (WDM) system.

By properly demultiplexing the optical signal and sending to different light-reflecting mirrors for separately programmed attenuation of signal strengths, and by optional tuning of the mirror reflections via a feedback system, the gain spectrum of the amplifier device combination can be made substantially flat over a range of wavelengths. The tunable system 138 comprises a demultiplexer in combination with a tunable light-reflecting MEMS mirror device and a multiplexer to put together the different wavelength channels into the optical fiber. The device 138 is connected to a feedback system 139, having a wavelength detector 137 coupled to the fiber 132 for detecting the wavelength response$_{tap}$. The feedback system 139 automatically adjusts the tuning of the device 138 depending upon$_{tap}$. Advantageously, system 130 can be a WDM system using a plurality of different wavelength signals, e.g. $_{s1}$ and $_{s2}$, and a plurality of tunable MEMS mirror devices coupled to one or more detectors.

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed is:

1. A micro-electro-mechanical device comprising:
   a component layer comprising a frame, a plurality of components disposed in an array in the frame, the components movably coupled to the frame, and a plurality of solder wettable metallized regions on the frame;
   an actuation layer comprising a plurality of actuators for moving the component, a plurality of conductive paths, and a plurality of solder wettable metallized regions, the actuation layer having a plurality-of electrodes laterally aligned for controlling the movement of the components;
   the component layer and the actuation layer bonded together with a bonding solder material by solder joints between metallized regions on the respective layers with a gap spacing and in lateral alignment so that the movement of the component is controlled by an electrical signal applied to the actuator;
   the component layer comprises at least one mirror component and the actuation layer comprises a plurality of electrodes for controlling each mirror; and,
   one or more spacers between the component layer and the actuator layer to control the gap spacing between the layers, the spacers free of the bonding solder material.

2. The device of claim 1 wherein the component is coupled to the frame via a movable gimbal.

3. The device of claim 1 wherein the vertical gap spacing between the component layer and actuation layer is within 10% of a predetermined gap spacing and the lateral alignment is with an accuracy of 5% of the component effective diameter.

4. The device of claim 3 wherein the vertical gap spacing between the component layer and actuation layer is within 5% of a predetermined gap spacing and the lateral alignment is with an accuracy of 1% of the component effective diameter.

5. The device of claim 1 wherein the component layer comprises silicon.

6. The device of claim 1 wherein the actuator layer comprises silicon.

7. The device of claim 1 wherein the component layer comprises a metal layer comprising Au, Ag, or Al.

8. The device of claim 1 wherein said one or more spacers is pre-attached to one of the component layer or the actuator layer and solder bonded to metallization pads on the other layer.

9. The device of claim 1 wherein said one or more spacers comprises a metal, ceramic, silicon or polymer material.

10. The device of claim 1 wherein said one or more spacer blocks more than 20% of the peripheral boundary around each component in the array of components for aerodynamic isolation from mirror movement in adjacent cells.

11. The device of claim 1 wherein said one or more spacers comprises conductive walls extending around the component for electrostatic isolation.

12. The device of claim 1 wherein said one or more spacers has a CTE which differs by less than 20% from the CTE of the solder.

13. The device of claim 1 wherein said one or more spacers is attached to either the component layer or the actuator layer.

14. The device of claim 1 wherein said one or more spacers comprises a permanent spacer.

15. The device of claim 1 wherein said one or more spacers comprises a drop-in permanent spacer which is trapped between the component layer and the actuator layer by compressive stress caused by solder joint solidification and thermal contraction.

16. The device of claim 1 wherein said one or more spacers comprises a spacer laterally aligned and constrained by an alignment notch.

17. A method of making a MEMs device comprising a component layer including an array of components movably coupled to the layer and an actuator layer including at least one conductive path and a plurality of actuators for moving the components, comprising the steps of:
   a) forming a plurality of solder-wettable metallization pads on a surface of the component layer and on a mating surface of the actuator level;
   b) applying solder between metallization pads of the respective layers;
   c) heating and bonding together the respective layers;
   d) determining the gap spacing between respective layers with one or more spacers; and,
   e) forming solder joints of predetermined gap spacing as set by the one or more spacers, between the metallization pads of the respective layers, the spacers free of the solder material.

18. The method of claim 17 wherein the quantity of solder between metallization pads is chosen to provide the predetermined gap spacing.

19. The method of claim 17 further comprising the step of disposing a spacer between the layers to control the spacing between them.

20. The method of claim 19 wherein the spacer is removed after formation of the solder joints.

21. The method of claim 19 wherein the spacer is left between the layers after formation of the solder joints.

22. The device of claim 1 wherein the component layer comprises a composite layer of silicon, insulator and silicon.

23. The device of claim 22 wherein the component comprises a mirror is formed on the layer of silicon proximal the actuator layer.

24. The device of claim 22 wherein the component comprises a mirror formed on the layer of silicon distal from the actuator layer.

25. The device of claim 24 wherein the layer of silicon proximal the actuation layer is configured to at least partially enclose the region underlying the mirror between the mirror and the actuation layer.

26. The device of claim 25 wherein the layer of silicon proximal the actuation layer is doped with impurities or coated with conductive material to provide electrostatic shielding of the mirror.

27. A micro-electro-mechanical (MEMS) device comprising:
   a) a component layer comprising a frame and a plurality of components movably connected to the frame;
   b) an actuator layer having at least one actuator for moving at least one component;
   c) a bonding layer comprising bonding material to bond the component layer to the actuator layer.
   d) at least one spacer, to separate the component layer and the actuator layer by a vertical gap spacing, the spacer providing between the actuator and the component a cavity with conductive peripheral walls; and,
   e) the component layer, the spacer and the actuator layer attached together with accurate lateral alignment and accurate gap spacing, the spacer free of the bonding material.

28. The MEMs device of claim 27 wherein the component layer and the actuator layer are bonded together.

29. The MEMs device of claim 27 wherein the component layer and the actuator layer are attached together by solder bonding, fusion bonding, glass frit bonding or adhesive bonding.

30. The MEMs device of claim 27 wherein the conductive peripheral walls block at least 20% of the peripheral area around the cavity of each cell in the array of components.

31. The MEMs device of claim 27 wherein the conductive peripheral walls have electrical resistivity of less than 10 ohm-cm.

32. The MEMs device of claim 27 wherein the conductive peripheral walls comprise metal or conductively doped semiconductor.

33. The MEMs device of claim 27 wherein the spacer comprises ferromagnetic material.

34. A micro-electro-mechanical (MEMs) device comprising:
   a) a component layer comprising a frame and an array of components in the component layer and movably connected to the frame;
   b) an actuator layer having an array of actuators for moving the component; and
   c) a bonding layer comprising bonding material to bond the component layer to the actuator layer.
   d) a stiffener frame disposed over the component layer, the frame having side walls bonded to the actuator layer, the frame free of the bonding material.

35. A micro-electro-mechanical (MEMs) device comprising:
   a) a component layer comprising a frame and at least one component movably connected to the frame;
   b) an actuator layer having at least one actuator for moving the component; and
   c) a frame disposed over the component layer, the frame having side walls bonded to the actuator layer, wherein the frame comprises at least one transparent plate overlying the component layer.

36. The MEMs device of claim 34 wherein the sidewalls are elastically compliant.

37. The MEMs device of claim 1 wherein the frame and sidewalls are hermetically sealed about the component layer.

* * * * *